(12) United States Patent
Park et al.

(10) Patent No.: US 10,608,025 B2
(45) Date of Patent: Mar. 31, 2020

(54) IMAGE SENSOR

(71) Applicant: SK hynix Inc., Icheon-Si (KR)

(72) Inventors: Sung-Kun Park, Cheongju-si (KR);
Kyoung-In Lee, Icheon-si (KR);
Kwang Hwangbo, Seoul (KR)

(73) Assignee: SK hynix Inc., Icheon-si (KR)

( * ) Notice: Subject to any disclaimer, the term of this patent is extended or adjusted under 35 U.S.C. 154(b) by 72 days.

(21) Appl. No.: 15/785,288

(22) Filed: Oct. 16, 2017

(65) Prior Publication Data
US 2018/0240826 A1 Aug. 23, 2018

(30) Foreign Application Priority Data

Feb. 20, 2017 (KR) ........................ 10-2017-0022006

(51) Int. Cl.
| | | |
|---|---|---|
| H04N 5/378 | (2011.01) | |
| H04N 5/374 | (2011.01) | |
| H04N 5/355 | (2011.01) | |
| H01L 27/146 | (2006.01) | |
| H04N 5/3745 | (2011.01) | |

(52) U.S. Cl.
CPC .... *H01L 27/14609* (2013.01); *H01L 27/1461* (2013.01); *H01L 27/1463* (2013.01); *H01L 27/1464* (2013.01); *H01L 27/14603* (2013.01); *H01L 27/14605* (2013.01); *H01L 27/14612* (2013.01); *H01L 27/14636* (2013.01); *H01L 27/14641* (2013.01); *H04N 5/3559* (2013.01); *H04N 5/374* (2013.01); *H04N 5/378* (2013.01); *H04N 5/37457* (2013.01); *H01L 27/14643* (2013.01)

(58) Field of Classification Search
CPC ........ H01L 27/14609; H01L 27/14603; H01L 27/1464; H01L 27/14641; H01L 27/14636; H01L 27/14612; H01L 27/1461; H01L 27/1463; H01L 27/14605; H01L 27/14643; H04N 5/37457; H04N 5/3559; H04N 5/378; H04N 5/374
See application file for complete search history.

(56) References Cited

U.S. PATENT DOCUMENTS

| | | | |
|---|---|---|---|
| 8,461,660 B2 | 6/2013 | Manabe | |
| 8,902,343 B1 * | 12/2014 | Mandelli | .............. H04N 5/3559 |
| | | | 250/208.1 |
| 2005/0224843 A1 * | 10/2005 | Boemler | .......... H01L 27/14603 |
| | | | 257/233 |
| 2007/0147132 A1 | 6/2007 | Lee et al. | |

(Continued)

*Primary Examiner* — Shahbaz Nazrul
(74) *Attorney, Agent, or Firm* — Perkins Coie LLP

(57) ABSTRACT

An image sensor device includes a photoelectric conversion element configured to receive incident light and generate photocharges in response to the received incident light; a floating diffusion coupled to the photoelectric conversion element to store the photocharges generated by the photoelectric conversion element, the floating diffusion having a first capacitance value; a conductive pattern electrically coupled to the floating diffusion; and a variable electrode located apart from the conductive pattern by a gap, wherein the conductive pattern and the variable electrode form a variable capacitor coupled to the floating diffusion and having a second capacitance value and operable to change an effective capacitance of the floating diffusion in response to a control signal applied to the variable electrode.

19 Claims, 13 Drawing Sheets

(56) References Cited

U.S. PATENT DOCUMENTS

| | | | |
|---|---|---|---|
| 2011/0211103 A1* | 9/2011 | Sakano | H04N 5/3559 348/308 |
| 2012/0256077 A1* | 10/2012 | Yen | H01L 27/14609 250/208.1 |
| 2014/0151531 A1* | 6/2014 | Yamashita | H01L 27/14607 250/208.1 |
| 2015/0229859 A1* | 8/2015 | Guidash | H04N 5/374 348/308 |
| 2016/0150174 A1* | 5/2016 | Hynecek | H04N 5/37457 348/308 |
| 2016/0219239 A1 | 7/2016 | Itoh | |
| 2016/0337567 A1* | 11/2016 | Okura | H01L 29/945 |

* cited by examiner

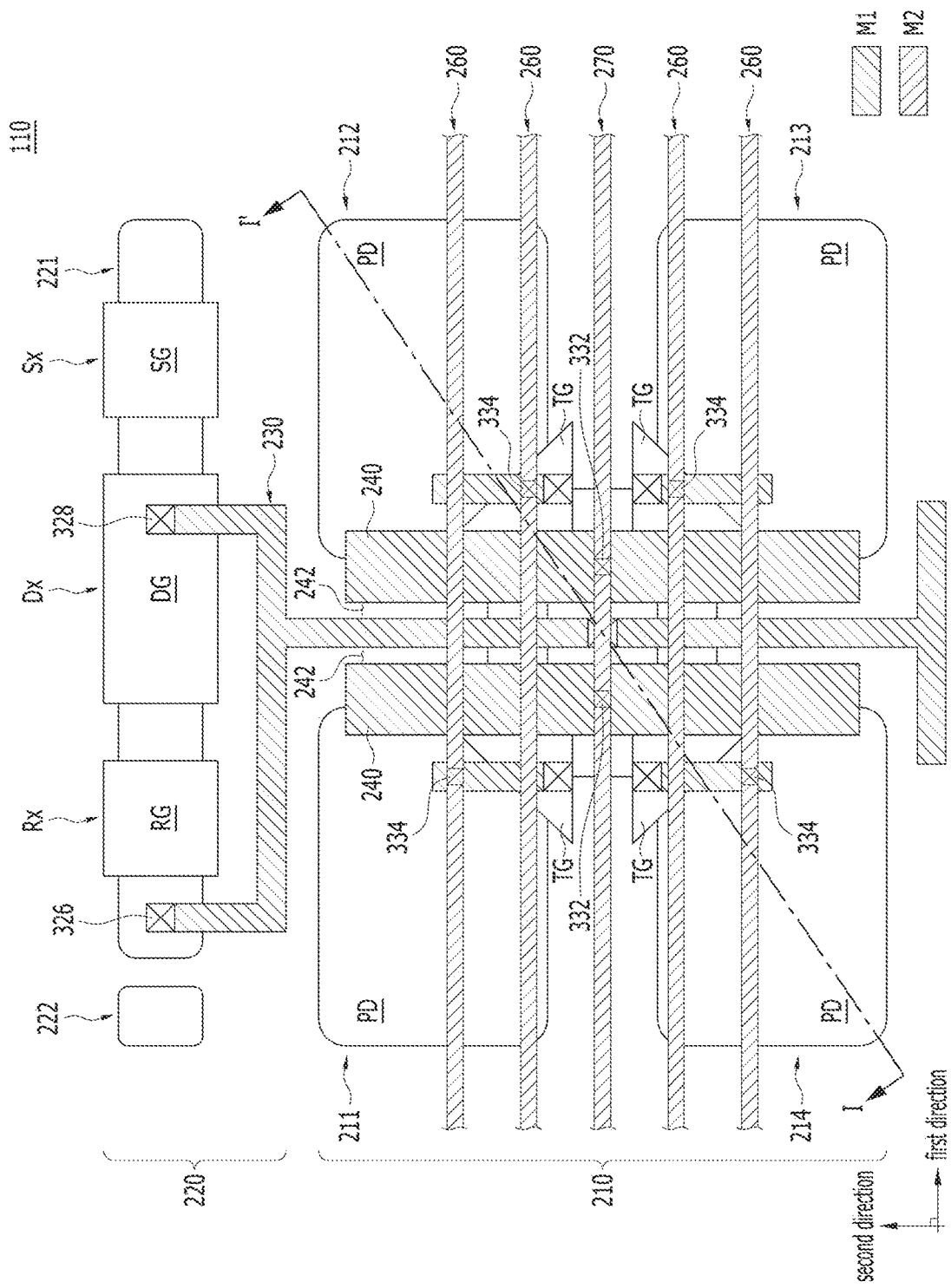

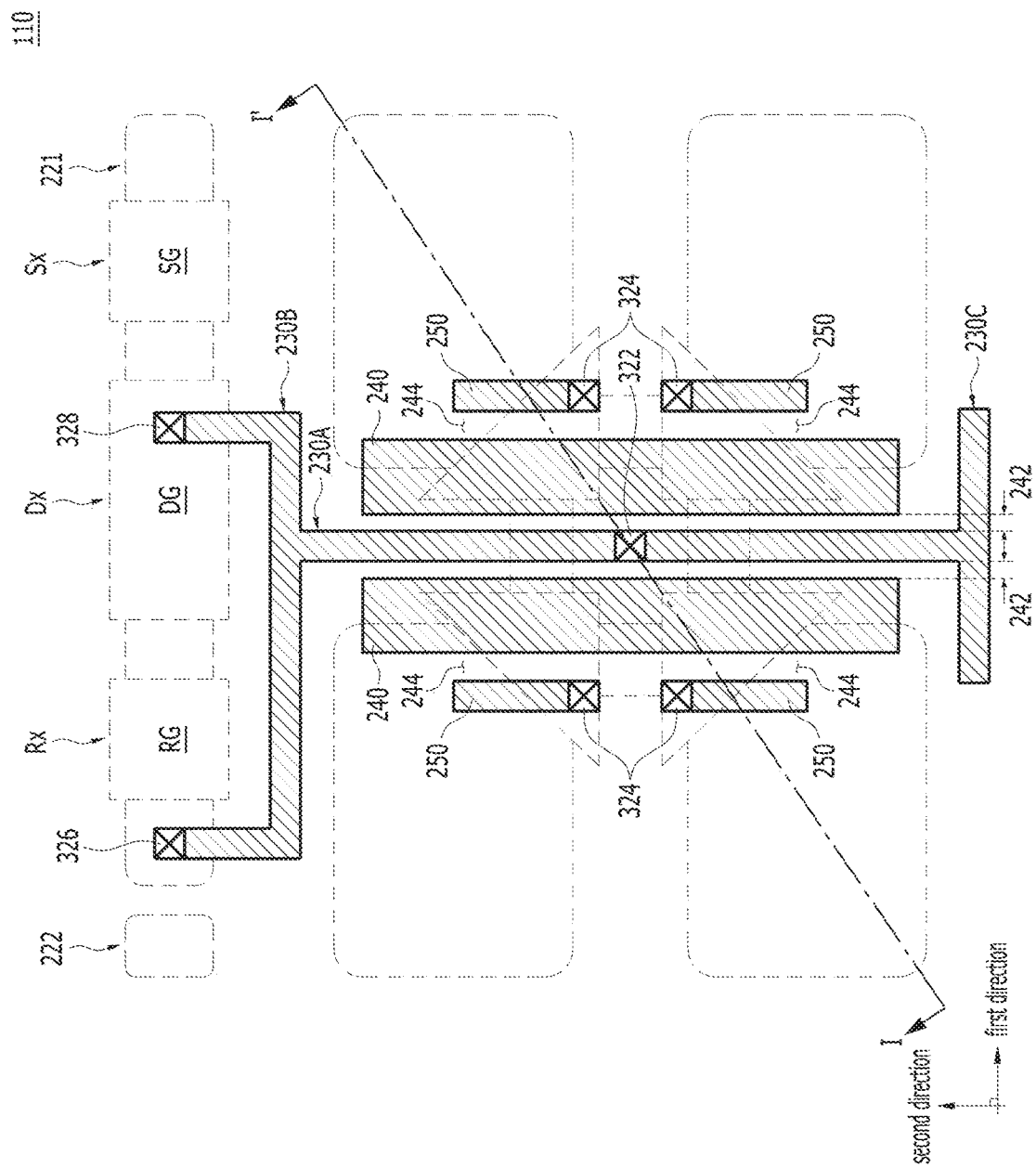

FIG. 10
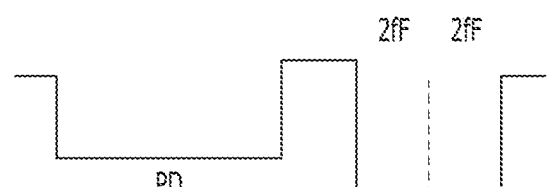
(A)
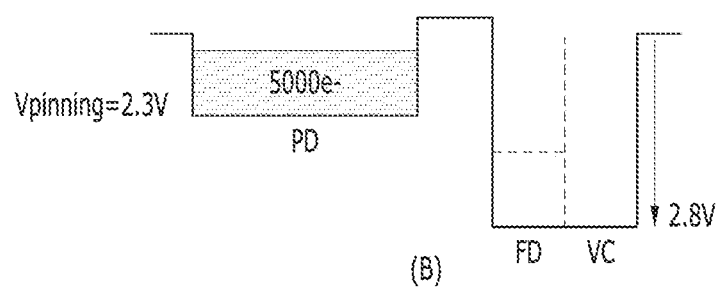
(B)
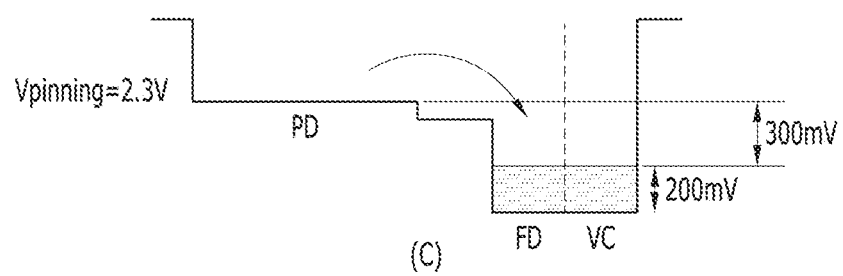
(C)
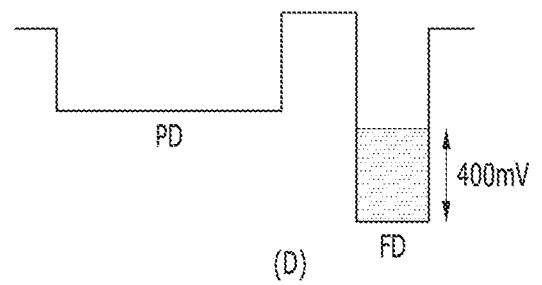
(D)

IMAGE SENSOR

CROSS-REFERENCE TO RELATED APPLICATION

This patent document claims the priority and benefits of Korean Patent Application No. 10-2017-0022006 filed on Feb. 20, 2017 in the Korean Intellectual Property Office, the disclosure of which is incorporated herein by reference in its entirety.

TECHNICAL FIELD

The technology and implementations disclosed in this patent document relate to semiconductor image sensors.

BACKGROUND

An image sensor is a device which receives light from an optical image or one or more objects and converts the received light into electrical signals forming an image. Recently, with the development of the computer industry and communication industry, the demand for an image sensor having improved performance is increasing in various fields or applications, including, e.g., a digital camera, a camcorder, a portable device such as a personal communication system, a game machine, a security camera, a medical micro-camera and a robot.

SUMMARY

Various embodiments are directed to an image sensor with improved performance and a method for operating the same.

In an embodiment, an image sensor device may include: a photoelectric conversion element configured to receive incident light and generate photocharges in response to the received incident light; a floating diffusion coupled to the photoelectric conversion element to store the photocharges generated by the photoelectric conversion element, the floating diffusion having a first capacitance value; a conductive pattern electrically coupled to the floating diffusion; and a variable electrode located apart from the conductive pattern by a gap, wherein the conductive pattern and the variable electrode form a variable capacitor coupled to the floating diffusion and having a second capacitance value and operable to change an effective capacitance of the floating diffusion in response to a control signal applied to the variable electrode.

Furthermore, the image sensor device may further include: a dielectric layer filling the gap. Furthermore, the image sensor device may further include: a reset transistor having a terminal coupled to the floating diffusion and operable to initialize the floating diffusion; and a driver transistor having a terminal coupled to the floating diffusion and operable to generate an output signal corresponding to an amount of the photocharges stored in the floating diffusion, wherein the conductive pattern electrically couples the floating diffusion to the reset transistor, and electrically couples the floating diffusion to the driving transistor.

The conductive pattern may have at least one sidewall which faces a sidewall of the variable electrode. The conductive pattern and the variable electrode may have a bar shape with a major axis extending in a same direction. A maximum value of the effective capacitance may be determined as a sum of the first capacitance value and the second capacitance value, and a minimum value of the effective capacitance may be determined as same as the first capacitance value.

In an embodiment, an image sensor device may include: a transfer gate formed over a substrate; a photoelectric conversion element and a floating diffusion formed in the substrate on the respective sides of the transfer gate; a first interlayer dielectric layer formed over the substrate, and covering the transfer gate; a conductive pattern formed over the first interlayer dielectric layer, and electrically coupled with the floating diffusion; and a variable electrode formed over the first interlayer dielectric layer and located apart from the conductive pattern with a first gap, wherein the variable electrode is operable to change an effective capacitance of the floating diffusion in response to a control signal applied to the variable electrode.

In some implementations, the image sensor device may further include: a reset transistor having a terminal coupled to the floating diffusion and operable to initialize the floating diffusion; and a driver transistor having a terminal coupled to the floating diffusion and operable to generate an output signal corresponding to an amount of photocharges stored in the floating diffusion, wherein the conductive pattern electrically couples the floating diffusion to the reset transistor, and electrically couples the floating diffusion to the driving transistor. In some implementations, the image sensor device may further include: a pad pattern formed over the first interlayer dielectric layer, and electrically coupled with the transfer gate. In some implementations, the variable electrode may be located apart from the pad pattern by a second gap with a width greater than that of the first gap. In some implementations, the variable electrode may be positioned between the conductive pattern and the pad pattern. In some implementations, the image sensor device may further include: a second interlayer dielectric layer formed over the first interlayer dielectric layer, covering the conductive pattern and the variable electrode, and filling the first gap.

In some implementations, the conductive pattern may have at least one sidewall which faces a sidewall of the variable electrode. The conductive pattern and the variable electrode may have a bar shape with a major axis extending in a same direction.

In an embodiment, a method for operating an image sensor device is provided to include: initializing an image sensor device with a floating diffusion to cause the floating diffusion to have a first capacitance value; applying a first control signal to the image sensor device to cause the floating diffusion to have an increased effective capacitance that is greater than the first capacitance value; and applying a second control signal to the image sensor device to cause the floating diffusion to have the effective capacitance smaller than the increased effective capacitance. In one embodiment, a method for operating an image sensor is provided to include a photoelectric conversion element suitable for generating photo charges in response to incident light; a floating diffusion suitable for storing temporarily the photo charges generated in the photoelectric conversion element, and having a first capacitance; and a variable capacitor coupled in series to the floating diffusion, having a second capacitance, and suitable for changing an effective capacitance of the floating diffusion in response to a control signal. The method may include: applying a first control signal to the variable capacitor when transferring the photocharges generated in the photoelectric conversion element, to the floating diffusion, such that the effective capacitance of the floating diffusion is larger than the first capacitance; and applying a second control signal to the variable capacitor when outputting an image signal corresponding to the photo charges stored in the floating diffusion, such that the effective capacitance of the floating diffusion is smaller than a sum of the first capacitance and the second capacitance.

In some implementations, the method may further include, after the initializing of the image sensor and before the applying of the second control signal: generating photocharges in the image sensor device; and transferring the generated photocharges to the floating diffusion. In some implementations, wherein, when initializing the floating diffusion before transferring the photocharges generated in the photoelectric conversion element, to the floating diffusion, the variable capacitor is also initialized by applying the first control signal to the variable capacitor. In some implementations, the increased effective capacitance may have a maximum value as same as a sum of the first capacitance value and the second capacitance value, and a minimum value same as the first capacitance value. In some implementations, the first control signal may have a polarity opposite to the second control signal. In some implementations, the first control signal may have a positive bias, and the second control signal may have a negative bias. In some implementations, the image sensor device may include a variable capacitor, the variable capacitor may include: a conductive pattern electrically coupled with the floating diffusion; and a variable electrode located apart from the conductive pattern by a gap, wherein the first and second control signals are applied to the variable electrode.

BRIEF DESCRIPTION OF THE DRAWINGS

FIG. 2 is a plan view illustrating a representation of an example of a pixel group of an example of an image sensor based on an embodiment of the disclosed technology.

FIGS. 3A and 3B are plan views illustrating representations of examples of layers of a pixel group of the image sensor in FIG. 2 based on an embodiment of the disclosed technology.

FIG. 10 is a schematic representation of an example of a diagram to explain a potential change and a capacitance change of a floating diffusion in an image sensor based on an embodiment of the disclosed technology.

DETAILED DESCRIPTION

Figure 1:
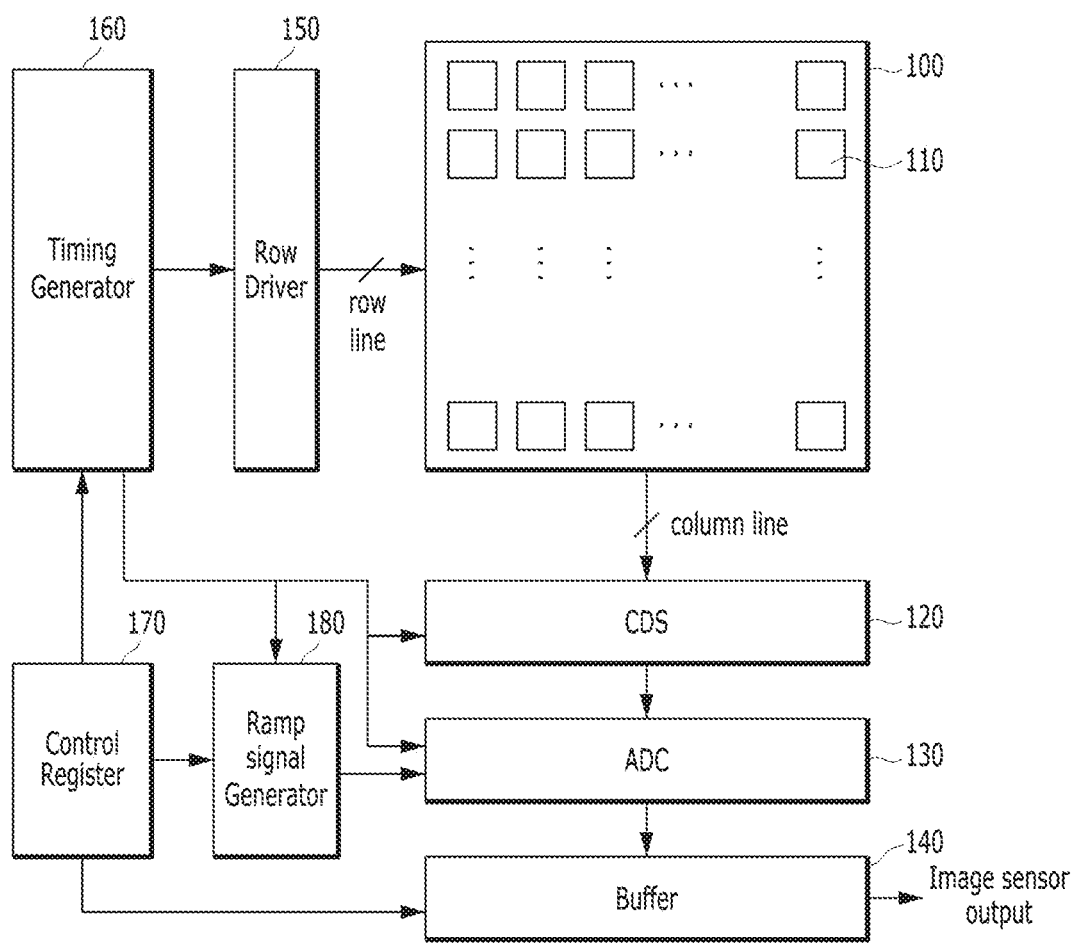
FIG. 1 is a block diagram schematically illustrating a representation of an example of an image sensor based on an embodiment of the disclosed technology.

The disclosed image sensing technology can be implemented to provide an electronic device including an image sensor to reduce an image lag, improve sensitivity and HDR (high dynamic range) characteristics.

The various implementations of the disclosed technology can be designed to provide an image sensor and its operating method, with improved properties. In some implementations, the image sensor with improved properties is capable of preventing occurrence of a lag while simultaneously improve sensitivity and realize an HDR (high dynamic range). In some implementations of the disclosed technology, an image sensor is configured to have improved properties by changing a conversion gain of the image sensor. To this end, some implementations of the disclosed technology provide an image sensor and its operating method that are capable of changing an effective capacitance of a floating diffusion depending on operations. The floating diffusion refers to an element of the image sensor including a CMOS image sensor, which operates to store photocharges generated in the image sensor.

In some existing image sensor designs, the capacitances of a photoelectric conversion element (for example, a photodiode) and a floating diffusion may have fixed values. For example, the capacitances of the photoelectric conversion element and the floating diffusion may not be changed between operations. Due to this fact, in such image sensors, it may be difficult to prevent an occurrence of a lag while concurrently improving sensitivity and HDR characteristics.

The fixed values of the floating diffusion makes difficult to provide the image sensor that can address both issues, preventing the occurrence of a lag and improving the sensitivity and HDR characteristics, at least based on the following grounds. In order to prevent the occurrence of a lag, the photoelectric conversion element needs to have a pinning voltage lower than the sum of a floating diffusion voltage in an initialized state (FD reset voltage) and a swing voltage of the floating diffusion changed depending on operations (Δ FD swing voltage). However, if the pinning voltage of the photoelectric conversion element decreases to prevent the occurrence of a lag, the capacitance of the photoelectric conversion element decreases as well, which deteriorates sensitivity of the image sensor. Also, in order to improve sensitivity and realize an HDR, the capacitance of the floating diffusion needs to be minimized. However, as the capacitance of the floating diffusion decreases, the swing voltage of the floating diffusion changed depending on operations (Δ FD swing voltage) increases, which causes a lag to occur. Based on the above, the occurrence of a lag has a trade-off relationship with sensitivity and HDR characteristics. Recently, as electronic appliances trend toward miniaturization, an image sensor has a shared pixel structure to increase the degree of integration. In the image sensor with the shared pixel structure, these problems in relation to the trade-off between the occurrence of a lag and the sensitivity and HDR characteristics become a major or serious issue.

The disclosed technology provide image sensor techniques that can be used to resolve the issues at the same time that balance the trade-off of different imaging features, including, for example, preventing the occurrence of a lag while improving sensitivity and HDR characteristics.

Various examples are described below in more detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a block diagram schematically illustrating a representation of an example of an image sensor based on an embodiment of the disclosed technology.

As shown in FIG. 1, the image sensor may include a pixel array 100, a correlated double sampling (CDS) 120, an analog-digital converter (ADC) 130, a buffer 140, a row driver 150, a timing generator 160, a control register 170, and a ramp signal generator 180. The plurality of pixel groups 110 may be arranged in a matrix structure. Each of the plurality of pixel groups 110 may have a 4-shared pixel structure.

The timing generator 160 generates one or more control signals for controlling the respective operations of the row driver 150, the correlated double sampling (CDS) 120, the analog-digital converter (ADC) 130 and the ramp signal generator 180. The control register 170 generates one or more control signals for controlling the respective operations of the ramp signal generator 180, the timing generator 160 and the buffer 140.

The row driver 150 is coupled to the pixel array 100 through a row line. The row driver 150 drives the pixel array 100 with the row line. For example, the row driver 150 may generate a select signal for selecting a particular row line among a plurality of row lines. The plurality of row lines are coupled with the plurality of pixel groups 110, respectively. One row line is coupled to each of the plurality of pixel groups 110.

The correlated double sampling 120 is coupled to the pixel array 150 through column lines. Each of the plurality of pixel groups 110 senses incident light, and outputs an image reset signal and an image signal to the correlated double sampling 120 through a column line. The correlated double sampling 120 performs sampling for each of the image reset signal and the image signal that are received from the pixel array 100. The plurality of pixel groups 110 are coupled to a plurality of column lines, respectively. One column line is coupled to each of the plurality of pixel groups 110. The analog-digital converter 130 is coupled with the correlated double sampling 120 and the ramp signal generator 180. The analog-digital converter 130 is configured to receive a sampling signal and a ramp signal from the correlated double sampling 120 and the ramp signal generator 180, respectively, compare the ramp signal which is outputted from the ramp signal generator 180 with the sampling signal which is outputted from the correlated double sampling 120, and output a comparison signal. In some implementations, the analog-digital converter 130 is coupled to the timing generator 160 which provides a clock signal to the analog-digital converter 130. The analog-digital converter 130 counts a level transition time of the comparison signal using the clock signal which is provided from the timing generator 160, and outputs a count value to the buffer 140. In some implementations, the timing generator is further coupled to the ram signal generator 180 and the ramp signal generator 180 may operate under control of the timing generator 160.

The buffer 140 is coupled to the analog-digital converter 130 to receive digital signals from the analog-digital converter 130. In some implementations, the buffer 140 may include a memory (not shown) and a sense amplifier (not shown). The buffer 140 stores digital signals which are outputted from the analog-digital converter 130. In some implementations, the memory of the buffer 140 stores the count values that are counted by and provided from the analog-digital converter 130. The count values may be associated with the signals outputted from the plurality of pixel groups 110. The buffer 140 is further configured to sense and amplify the stored digital signals, and outputs the amplified resultant signals. The sense amplifier of the buffer 140 is structured to sense and amplify the respective count values which are outputted from the memory.

Figure 3A:
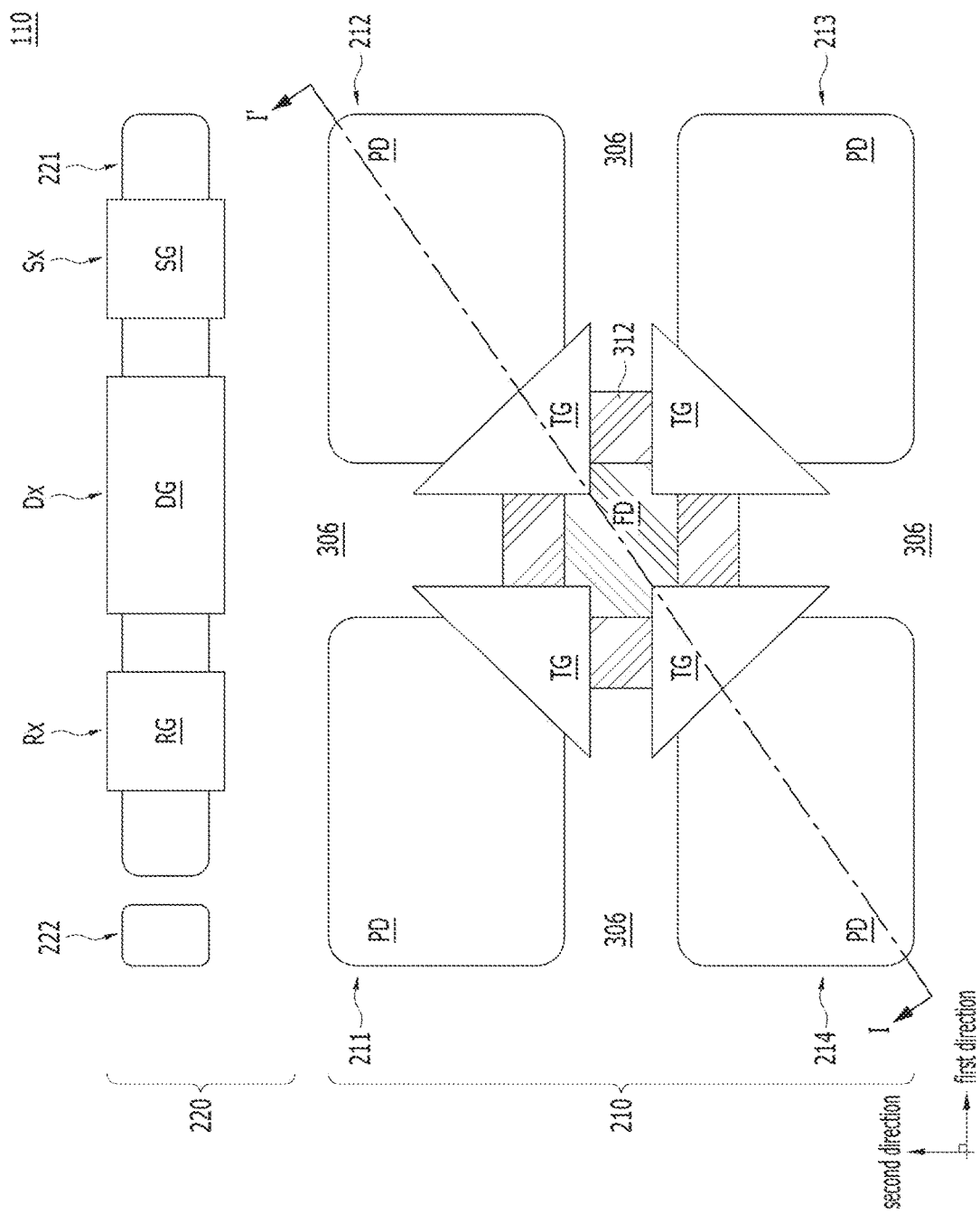
Figure 4:
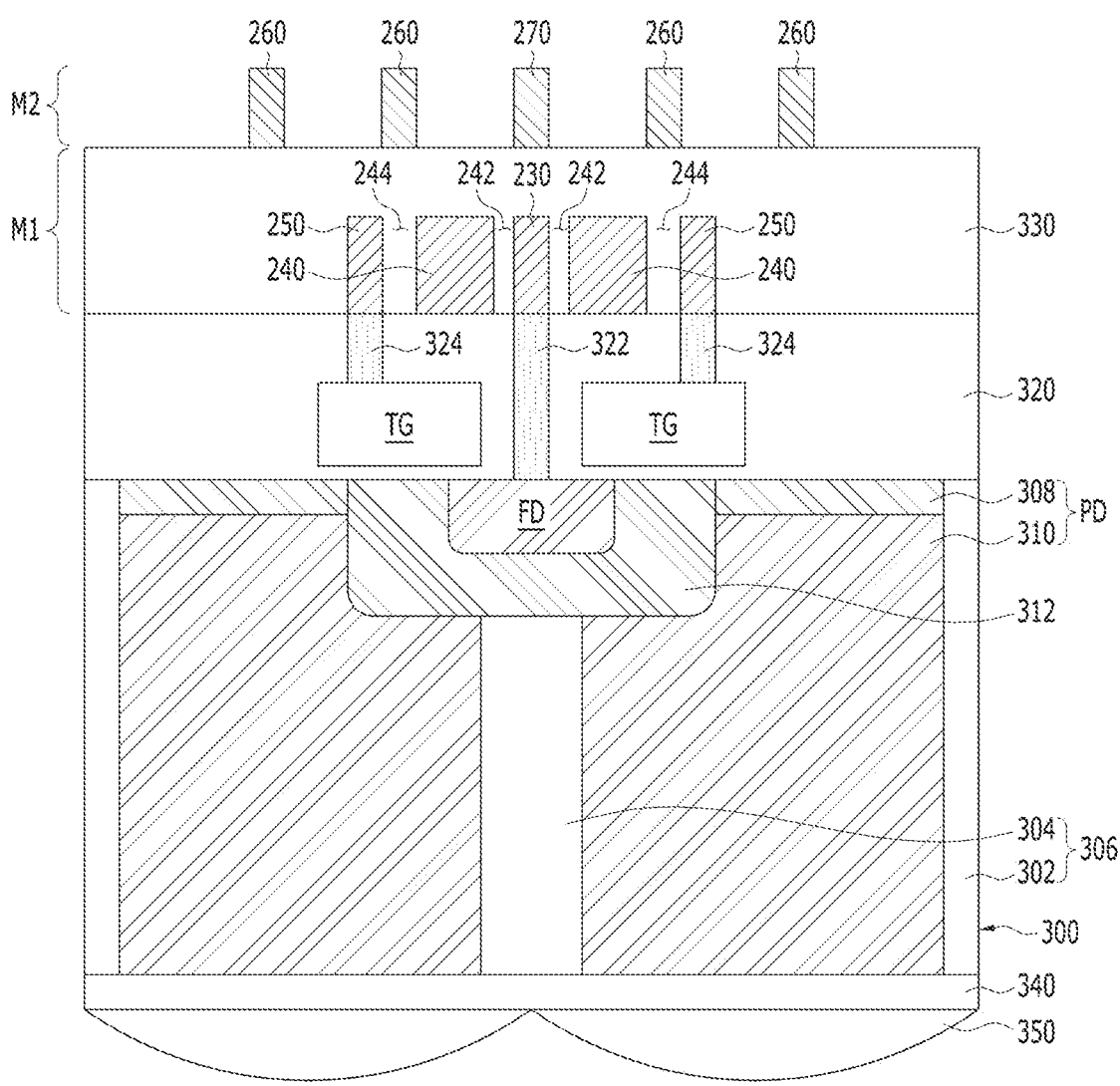
FIG. 4 is a cross-sectional view taken along the line I-I' of FIGS. 2, 3A and 3B, illustrating a representation of an example of a pixel group of the image sensor in FIG. 2 based on an embodiment of the disclosed technology.

FIG. 2 is a plan view illustrating a representation of an example of a pixel group of an image sensor in accordance with an embodiment of the disclosed technology. FIGS. 3A and 3B are plan views illustrating representations of examples of layers of a pixel group of the image sensor in FIG. 2 in accordance with an embodiment of the disclosed technology, wherein FIG. 3A is a plan view illustrating a layer in which gates of transistors are formed and FIG. 3B is a plan view illustrating a layer in which first metal lines are formed, the first metal line located upper than the layer in which the gates of the transistors are formed. FIG. 4 is a cross-sectional view taken along the line I-I' of FIGS. 2, 3A and 3B, and illustrating a representation of an example of a pixel group of the image sensor based on an embodiment of the disclosed technology.

Figure 8:
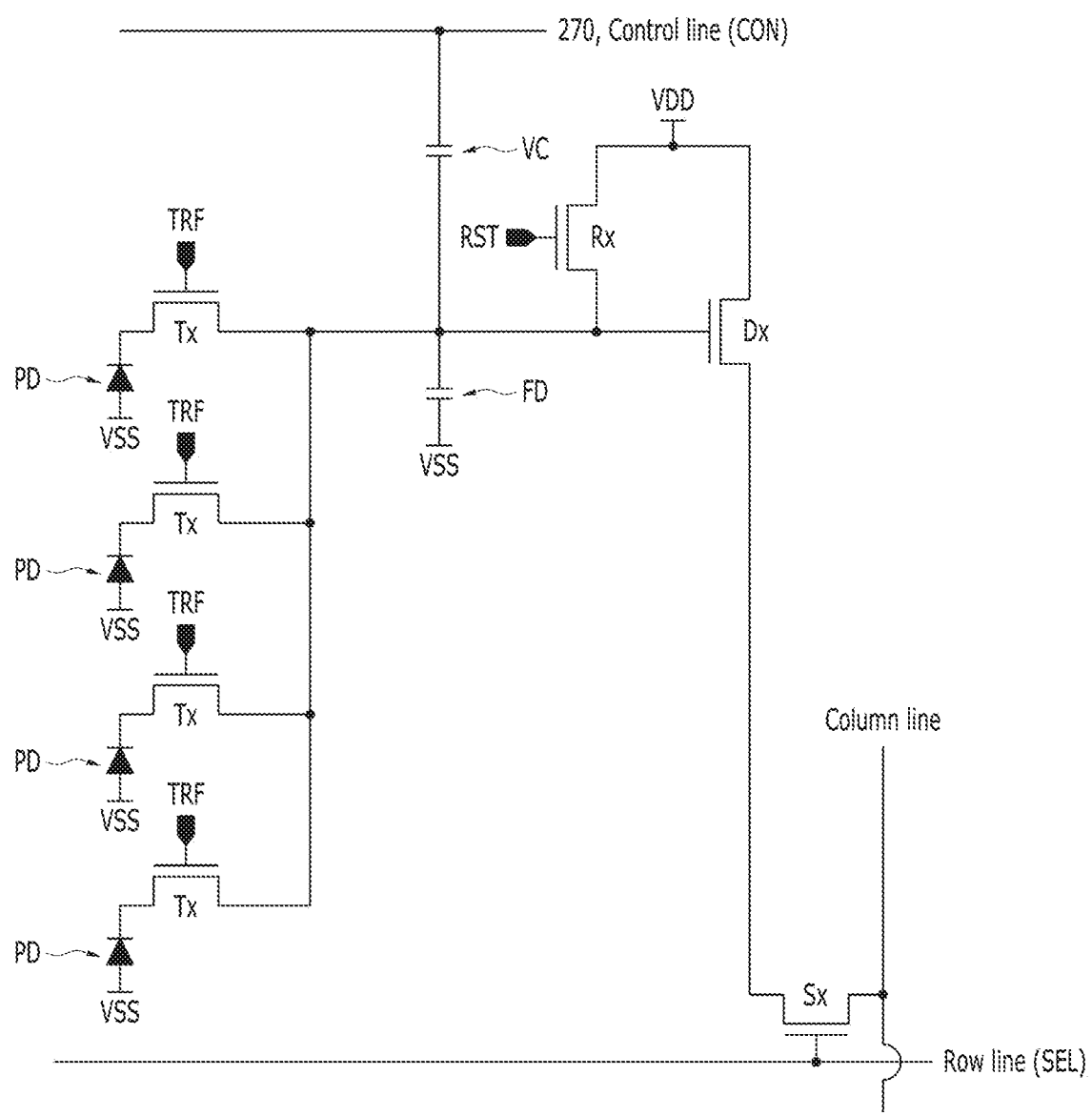
FIG. 8 is an equivalent circuit diagram illustrating a representation of an example of a pixel group of an image sensor based on an embodiment of the disclosed technology.

The image sensor based on the disclosed technology may include, in some implementations, photoelectric conversion elements PD which generate photocharges in response to incident light, a floating diffusion FD in which the photocharges generated in the photoelectric conversion elements PD are stored temporarily, and a variable capacitor VC (see FIG. 8 for example) which is coupled in series with the floating diffusion FD to change an effective capacitance of the floating diffusion FD in response to a control signal CON (see FIG. 8 for example). The variable capacitor VC may include a conductive pattern 230 which is electrically coupled to the floating diffusion FD, a variable electrode 240 which is spaced apart from the conductive pattern 230 by a first gap 242, and a dielectric layer which fills the first gap 242. As shown in FIGS. 2, 3B and 4, despite the first gap 242, the variable electrode 240 and the conductive pattern 230 are still located relatively close to each other and variable electrodes 240, if arranged in multiple, may be structured to partially surround the variable electrode 240.

As shown in FIGS. 2, 3A and 4, the image sensor in accordance with the embodiment may include the pixel group 110 which has a 4-shared pixel structure. For example, the pixel group 110 which has the 4-shared pixel structure may be arranged in a shape in which four pixels 211, 212, 213 and 214 arranged in a 2×2 matrix structure share one floating diffusion FD.

The pixel group 110 of the image sensor in accordance with the embodiment may include a light receiving unit 210 which generates photocharges in response to incident light, and a driving unit 220 which outputs an image signal and an image reset signal corresponding to the photocharges generated in the light receiving unit 210. Also, the pixel group 110 of the image sensor in accordance with the embodiment may include an isolation structure 306 which is formed in a substrate 300 to isolate adjacent structures, and a well 312 which is formed in the substrate 300.

In the pixel group 110 of the image sensor in accordance with the embodiment, the light receiving unit 210 may include the plurality of pixels 211, 212, 213 and 214 which share the floating diffusion FD. For example, the pixel group 110 may include a first pixel 211 to a fourth pixel 214. Each of the plurality of pixels 211, 212, 213 and 214 may include a photoelectric conversion element PD which generates photocharges in response to incident light, and a transfer transistor Tx which transfers the photocharges generated in the photoelectric conversion element PD, to the floating diffusion FD in response to a transfer signal TRF (see FIG. 8 for example). The floating diffusion FD may be positioned at the center of the light receiving unit 210, and be disposed in a shape in which the plurality of pixels 211, 212, 213 and 214 surround the floating diffusion FD.

The photoelectric conversion element PD may include an organic or inorganic photodiode. For example, the photoelectric conversion element PD may possess a shape in which a first impurity region 308 and a second impurity region 310 formed in the substrate 300 and having complementary conductivity types are stacked in the vertical direction. The first impurity region 308 may be or include a P-type impurity region, and the second impurity region 310 may be or include an N-type impurity region. The second impurity region 310 may have a thickness greater than the first impurity region 308. In the vertical direction, the second impurity region 310 may have a uniform doping profile or a non-uniform doping profile in which an impurity doping concentration decreases in a direction facing away from a transfer gate TG.

The substrate 300 may include a semiconductor substrate. The semiconductor substrate may be or include a single crystalline state, and include a silicon-containing material. For example, the substrate 300 may include a single crystalline silicon-containing material. The substrate 300 may be or include a substrate which is thinned through a thinning process or a substrate which includes an epitaxial layer formed through epitaxial growth. For instance, the substrate 300 may be or include a bulk silicon substrate which is thinned through a thinning process.

The transfer transistor Tx may include the transfer gate TG which is formed over the substrate 300 and has both ends which overlap with a portion of the photoelectric conversion element PD and a portion of the floating diffusion FD, respectively. The transfer signal TRF may be applied to the transfer gate TG, and the photoelectric conversion element PD and the floating diffusion FD may serve as the source and the drain, respectively, of the transfer transistor Tx.

The isolation structure 306 may perform the function of electrically isolating adjacent pixel groups 110 from one another, electrically isolating the light receiving unit 210 from the driving unit 220 in each pixel group 110, and electrically isolating the plurality of adjacent pixels 211, 212, 213 and 214 from one another in the light receiving unit 210. The isolation structure 306 may include an STI (shallow trench isolation), a DTI (deep trench isolation) or a potential barrier. The potential barrier may include an impurity region which is formed by implanting an impurity into the substrate 300. For example, the potential barrier may be or include a P-type impurity region which is formed by implanting boron as a P-type impurity into the substrate 300. The isolation structure 306 may be constructed by any one or a combination of at least two selected among the STI, the DTI, or the potential barrier. For example, the isolation structure 306 may include a first isolation structure 302 which isolates the plurality of adjacent pixels 211, 212, 213 and 214 from one another, and a second isolation structure 304 which is formed under the well 312. The first isolation structure 302 may be any one or a combination of at least two selected among the STI, the DTI, or the potential barrier. The second isolation structure 304 may be or include the potential barrier. In the present embodiment, it is illustrated that the first isolation structure 302 is the DTI and the second isolation structure 304 is the potential barrier, for example, the P-type impurity region. Other implementations are also possible to construct the first isolation structure 302 and the second isolation structure 304.

The well 312 is to provide a space in which the floating diffusion FD is to be formed and the channel of the transfer transistor Tx, and may have a P conductivity type. When the second isolation structure 304 is or includes the potential barrier, for example, the P-type impurity region, the well 312 may have the same conductivity type as the second isolation structure 304 with an impurity doping concentration greater than the second isolation structure 304. The floating diffusion FD formed in the well 312 may include an impurity region which has a conductivity type complementary to the well 312. For example, the floating diffusion FD may include an N-type impurity region. The floating diffusion FD may have a first capacitance, and the first capacitance may have a fixed value that is not changed depending on operations.

In the pixel group 110 of the image sensor in accordance with the embodiment of the disclosed technology, the driving unit 220 may generate an image signal and an image reset signal corresponding to the photocharges generated in the light receiving unit 210, and output the generated image signal and image reset signal to a column line (not shown) in response to a select signal SEL (see FIG. 8) applied through a row line (not shown). The driving unit 220 may be positioned on one side of the light receiving unit 210 in a second direction or a column direction, and include a plurality of pixel transistors and a pickup region 222 which controls ground potential. The plurality of pixel transistors and the pickup region 222 may be positioned on the same line in a first direction or a row direction.

The plurality of pixel transistors may include a reset transistor Rx, a driver transistor Dx and a selection transistor Sx. The reset transistor Rx, the driver transistor Dx and the selection transistor Sx may share one active region 221, and include a reset gate RG, a driver gate DG and a selection gate SG, respectively. The reset transistor Rx may initialize the floating diffusion FD and the variable capacitor VC in response to a reset signal RST (see FIG. 8) applied to the reset gate RG. The driver transistor Dx may generate output signals corresponding to the amount of the photocharges stored in the floating diffusion FD and the variable capacitor VC, for example, the image signal and the image reset signal. The active region 221 may have a major axis and a minor axis, and possess a bar shape in which the major axis extends in the first direction. The driver gate DG may be positioned at the center of the active region 221, and the reset gate RG and the selection gate SG may be positioned on one side and the other side, respectively, of the driver gate DG. Junction regions (that is, sources and drains) may be formed in the active region 221 on both sides of the reset gate RG, the driver gate DG and the selection gate SG. The column line may be coupled to the junction region on one side of the selection gate SG. A power supply voltage VDD may be applied to the junction region between the driver gate DG and the reset gate RG. The row line may be coupled to the selection gate SG.

The pickup region 222 may be used to control the ground potential of the light receiving unit 210 and the driving unit 220, and include an impurity region which is formed in the substrate 300. A predetermined bias, for example, a ground voltage VSS, may be applied to the substrate 300 which is formed with the light receiving unit 210 and the driving unit 220, through the pickup region 222.

As shown in FIGS. 2, 3B and 4, the pixel group 110 of the image sensor based on the embodiment may include a first interlayer dielectric layer 320 which is formed on the substrate 300, the conductive pattern 230 which is formed on the first interlayer dielectric layer 320 and electrically couples the light receiving unit 210 and the driving unit 220, and the variable electrode 240 which is formed on the first interlayer dielectric layer 320, spaced apparat from the conductive pattern 230 by the first gap 242, and configured to change the effective capacitance of the floating diffusion FD in response to the control signal CON. Also, the pixel group 110 of the image sensor in accordance with the embodiment may include pad patterns 250 which are formed on the first interlayer dielectric layer 320 to overlap with the transfer gates TG, a second interlayer dielectric layer 330 which is formed on the first interlayer dielectric layer 320, transfer lines 260 which are formed on the second interlayer dielectric layer 330 and are coupled with the pad patterns 250, and a control line 270 which is formed on the second interlayer dielectric layer 330 and is coupled to the variable electrode 240.

The first interlayer dielectric layer 320 may include the transfer gates TG, the reset gate RG, the driver gate DG and the selection gate SG. The first interlayer dielectric layer 320 may be formed on the substrate 300 to cover the gates of the pixel transistors. The first interlayer dielectric layer 320 may include a single layer or a multi-layer, which is selected or includes an oxide, a nitride, or an oxynitride.

The conductive pattern 230 which couples the light receiving unit 210 and the driving unit 220 may be formed in the process of forming first metal lines M1. In some implementations, the conductive pattern 230 may be electrically coupled to the floating diffusion FD of the light receiving unit 210. In some implementations, the conductive pattern 230 may be electrically coupled to one of the junction regions (for example, the source region) of the reset gate RG of the driving unit 220 and the driver gate DG of the driving unit 220. The conductive pattern 230 and the floating diffusion FD may be electrically coupled with each other by a first contact plug 322 which passes through the first interlayer dielectric layer 320. The conductive pattern 230 and the one side junction region of the reset gate RG may be electrically coupled with each other by a third contact plug 326 which passes through the first interlayer dielectric layer 320. The conductive pattern 230 and the driver gate DG may be electrically coupled with each other by a fourth contact plug 328 which passes through the first interlayer dielectric layer 320.

The conductive pattern 230 may have at least one sidewall which faces the sidewall of the variable electrode 240. For example, the conductive pattern 230 may include a first region 230A, a second region 230B and a third region 230C. The first region 230A is brought into contact with the first contact plug 322, has the sidewall which faces the sidewall of the variable electrode 240, and has a bar shape of which major axis extends in the second direction. The second region 230B is brought into contact with the third contact plug 326 and the fourth contact plug 328, and is coupled to one end of the first region 230A. The third region 230C is coupled to the other end of the first region 230A, and possesses a bar shape of which major axis extends in the first direction. The ends of the first regions 230A that are respectively coupled to the second region 230B and the third region 230C oppose each other along the second direction. The second region 230B and the third region 230C of the conductive pattern 230 may have sidewalls which face the variable electrode 240, similarly to the first region 230A of the conductive pattern 230. This configuration of the second region 230B and the third region 230C in connection with the variable electrode 240 allows to increase an area by which the sidewall of the conductive pattern 230 and the sidewall of the variable electrode 240 face each other, for example, an overlapping area in the first direction. Accordingly, it is possible to effectively change the effective capacitance of the floating diffusion FD.

The variable electrode 240 operates to change the effective capacitance of the floating diffusion FD in response to the control signal CON depending on operations, and may be formed in the process of forming the first metal lines M1. In some implementations, the conductive pattern 230 and the variable electrode 240 may be formed simultaneously, and may be positioned in the same layer.

The variable electrode 240 may have the sidewall which faces the conductive pattern 230, and possess a bar shape of which major axis extends in the second direction. The variable electrode 240 may be positioned between the conductive pattern 230 and the pad patterns 250. In the pixel group 110, two variable electrodes 240 may be formed to be positioned on both sides of the first region 230A of the conductive pattern 230. The arrangement of the variable electrode 240 may be modified in various implementations of the disclosed technology. For example, in a modified example, only one variable electrode 240 may be formed on one of sides of the first region 230A of the conductive pattern 230.

The variable electrode 240 may be located apart from the conductive pattern 230 by the first gap 242. For example, the variable electrode 240 may be located apart from the first region 230A of the conductive pattern 230 with the first gap 242. The width of the first gap 242 may be adjusted such that coupling may occur between the conductive pattern 230 and the variable electrode 240. The variable electrode 240 and the conductive pattern 230 are located apart from each other by the first gap 242 and have the sidewalls facing each other and serve as the variable capacitor VC which is coupled in series to the floating diffusion FD. While it is illustrated in the present embodiment that the first region 230A of the conductive pattern 230 is apart from the variable electrode 240 by the first gap 242 and the second region 230B and the third region 230C of the conductive pattern 230 are apart from the variable electrode 240 by a gap greater than the first gap 242, it is to be noted that other implementations are also possible. For example, it is also possible to arrange the second region 230B and the third region 230C such that the second region 230B and the third region 230C have sidewalls that face the variable electrode 240 and are separated from the variable electrode 240 by the first gap 242. By doing so, the image sensor can further increase, within a limited area, the capacitance of the variable capacitor VC constructed by the variable electrode 240 and the conductive pattern 230.

The pad patterns 250 are configured to electrically couple the transfer lines 260 with the transfer gates TG, and may be formed in the process of forming the first metal lines M1. For example, the conductive pattern 230, the variable electrode 240 and the pad patterns 250 may be formed simultaneously, and may be positioned in the same layer. The pad patterns 250 may overlap with the transfer gates TG, and may be electrically coupled with the transfer gates TG through second contact plugs 324 which pass through the first interlayer dielectric layer 320. Each of the pad patterns 250 may possess a bar shape of which major axis extends in the second direction, and be disposed side by side with the variable electrode 240. The pad patterns 250 may be apart from the variable electrode 240 by a second gap 244 that has a width greater than the first gap 242. This configuration of the pad patterns 250 in connection with the variable electrode 240 allows to prevent the effective capacitance of the floating diffusion FD from being changed by a signal applied to the pad patterns 250, for example, the transfer signal TRF.

The second interlayer dielectric layer 330 which is formed on the first interlayer dielectric layer 320 may be an IMD (inter-metal dielectric) which includes therein the conductive pattern 230, the variable electrode 240 and the pad patterns 250. Furthermore, by filling the first gap 242, the second interlayer dielectric layer 330 may serve as the dielectric layer of the variable capacitor VC which includes the variable electrode 240 and the conductive pattern 230. The second interlayer dielectric layer 330 may include a single layer or a multi-layer that is selected or includes an oxide, a nitride, or an oxynitride. While it is illustrated in the embodiment that the second interlayer dielectric layer 330 fills the first gap 242, it is to be noted that the embodiment is not limited thereto. For example, in a modified example, dielectric spacers are formed on the sidewalls of the variable electrode 240 and the conductive pattern 230 to fill the first gap 242. The dielectric spacers may have a thickness (or a line width) that is sufficient to fill the first gap 242 and insufficient to fill the second gap 244.

The control line 270 and the transfer lines 260 may be formed in the process of forming second metal lines M2. For example, the control line 270 and the transfer lines 260 may be formed simultaneously, and may be positioned in the same layer. The control line 270 and the transfer lines 260 may extend in the first direction from the row driver 150 (see FIG. 1). The control line 270 may be electrically coupled with the variable electrode 240 through fifth contact plugs 332 which pass through the second interlayer dielectric layer 330. The variable electrode 240 may change the effective capacitance of the floating diffusion FD in response to the control signal CON which is transferred through the control line 270. The transfer lines 260 may be electrically coupled with the pad patterns 250 through sixth contact plugs 334 which pass through the second interlayer dielectric layer 330. The transfer gates TG may electrically couple the photoelectric conversion elements PD and the floating diffusion FD in response to the transfer signals TRF transferred through the transfer lines 260.

As shown in FIG. 4, the image sensor in accordance with the embodiment may include a color separation element 340 which is formed on the incident surface of the substrate 300, and a light focusing element 350 which is formed on the color separation element 340. The color separation element 340 may include a color filter, and the color filter may include any one of a red filter, a green filter, a blue filter, a cyan filter, a yellow filter, a magenta filter, a white filter, a black filter, or an IR cutoff filter. The light focusing element 350 may include a digital lens or a hemispherical lens.

Moreover, while not shown in the drawing, the image sensor in accordance with the embodiment may further include a protection layer which is formed between the substrate 300 and the color separation element 340. The protection layer may have negative fixed charges that function to improve a dark current characteristic. The protection layer may include a metal oxide which contains a metal element such as hafnium (Hf), zirconium (Zr), aluminum (Al), tantalum (Ta), titanium (Ti), Yttrium (Y), or lanthanoids.

The image sensor described above includes the variable capacitor VC capable of changing the effective capacitance of the floating diffusion FD. Thus, it is possible to prevent occurrence of a lag while concurrently improving sensitivity and HDR characteristics. In this regard, the maximum value of the effective capacitance of the floating diffusion FD may be the sum of the capacitance value of the floating diffusion FD ("first capacitance values") and the capacitance value of the variable capacitor VC ("second capacitance values"), and the minimum value of the effective capacitance of the floating diffusion FD may be the first capacitance values. In an equilibrium state in which the control signal CON is not applied to the variable electrode 240, the second capacitance values may be determined by the area of the sidewalls of the conductive pattern 230 or the variable electrode 240, while the conductive pattern 230 and the variable electrode face each other and are separated from each other by the first gap 242.

Since the variable capacitor VC is realized by using the conductive pattern 230 coupled to the floating diffusion FD and the variable electrode 240 located apart from the conductive pattern 230 by the first gap 242, a separate area for the variable capacitor VC is not needed. Accordingly, characteristics can be improved without increasing a pixel size or the size of the pixel group 110.

Hereafter, a method for operation the image sensor in accordance with the embodiment will be described in detail with reference to drawings. To facilitate the understanding of the operating method suggested in this patent documents, descriptions will be made below in comparison with an image sensor of a comparative example in which the capacitances of the photoelectric conversion element PD and the floating diffusion FD are fixed. For the sake of convenience in explanation, the same reference symbols will be used to refer to the same components.

Figure 5:
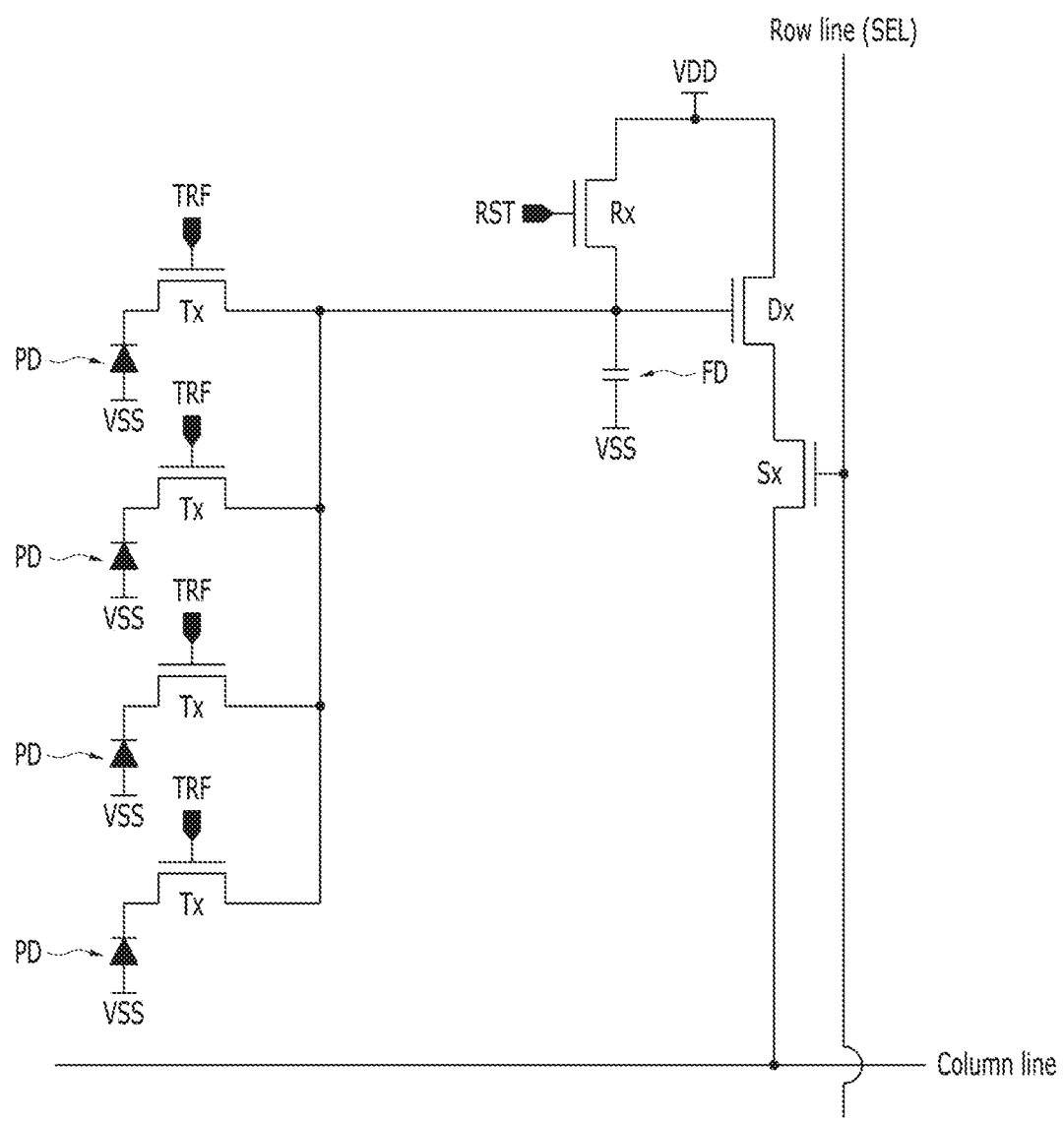
FIG. 5 is an equivalent circuit diagram illustrating a representation of an example of a pixel group of an image sensor based on a comparative example.

FIG. 5 is an equivalent circuit diagram illustrating a representation of an example of a pixel group of an image sensor based on the comparative example.

As shown in FIG. 5, the pixel group of the image sensor based on the comparative example may include a light receiving unit and a driving unit. The light receiving unit may include a plurality of light receiving units, and each of the plurality of light receiving units may include a photoelectric conversion element PD and a transfer transistor Tx. The driving unit may include a reset transistor Rx, a driver transistor Dx and a selection transistor Sx.

The photoelectric conversion element PD may be or include a photodiode. The photoelectric conversion element PD may be coupled between a ground node VSS and the transfer transistor Tx. The transfer transistor Tx may be coupled between the photoelectric conversion element PD and a floating diffusion FD. The transfer transistor Tx may operate in response to a transfer signal TRF which is applied to a transfer gate TG.

A first terminal (for example, the drain) of the reset transistor Rx may be coupled to a node which is set to a power supply voltage VDD, and a second terminal (for example, the source) of the reset transistor Rx may be coupled to the floating diffusion FD. The reset transistor Rx may operate in response to a reset signal RST which is applied to a reset gate RG. The gate of the driver transistor Dx, that is, a driver gate DG may be coupled to the floating diffusion FD. A first terminal (for example, the drain) of the driver transistor Dx may be coupled to the node which is set to the power supply voltage VDD, and a second terminal (for example, the source) of the driver transistor Dx may be coupled to the selection transistor Sx. The gate of the selection transistor Sx, that is, a selection gate SG may be coupled to a row line which extends from the row driver 150 (see FIG. 1). A first terminal (for example, the drain) of the selection transistor Sx may be coupled to the driver transistor Dx, and a second terminal (for example, the source) of the selection transistor Sx may be coupled to a column line. The selection transistor Sx may output the image signal or the image reset signal generated in the driver transistor Dx, to the column line, in response to a select signal SEL applied to the selection gate SG through the row line. The image signal or the image reset signal may have an output voltage which is generated by processing the power supply voltage VDD. The generated output voltage of the image signal or the image reset signal may correspond to the amount of the photocharges stored in the floating diffusion FD.

Figure 6:
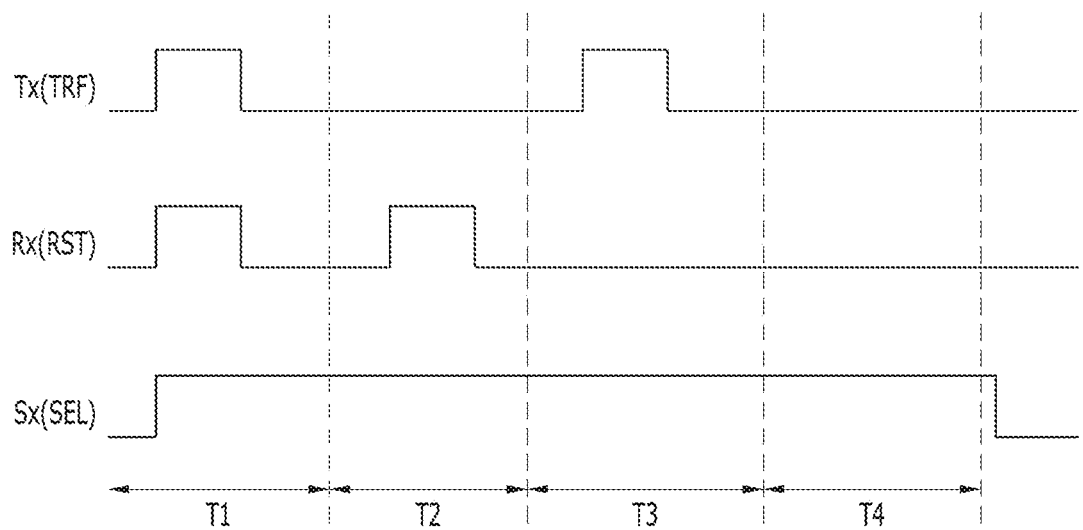
FIG. 6 is a representation of an example of a timing diagram to explain an operation of an image sensor based on a comparative example.
Figure 7:
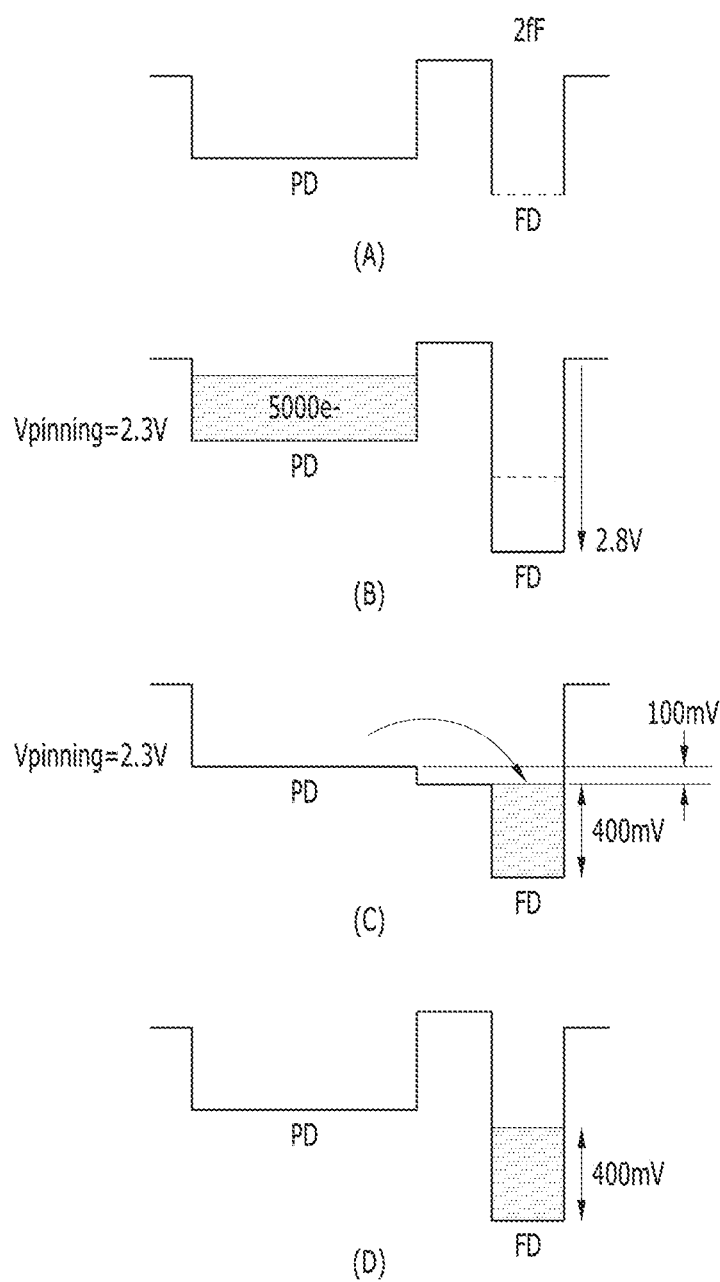
FIG. 7 is a schematic representation of an example of a diagram to explain a potential change of a floating diffusion in an image sensor based on a comparative example.

FIG. 6 is a representation of an example of a timing diagram to explain the operation of the image sensor based on the comparative example, and FIG. 7 is a schematic representation of an example of a diagram to explain a potential change of the floating diffusion between operations in the image sensor based on the comparative example. The transfer transistor Tx shown in FIG. 6 indicates the transfer transistor Tx of any one of the plurality of light receiving units shown in FIG. 5. In FIG. 6, the reference symbols T1, T2, T3 and T4 respectively correspond to the reference symbols (A), (B), (C) and (D) of FIG. 7. In FIG. 7, it is assumed that the pinning voltage of the photoelectric conversion element PD is 2.3V and the capacitance of the floating diffusion FD is 2 fF.

As shown in FIGS. 5 to 7, in a first period T1, the photoelectric conversion element PD is initialized by activating the transfer transistor Tx and the reset transistor Rx. The selection transistor Sx is activated during the first period T1 and continues being activated during the second period T2 to the fourth period T4.

Next, in a second period T2, the transfer transistor Tx is deactivated and the reset transistor Rx is turned on and turned off. During the second period T2, when the transfer transistor Tx is deactivated and the reset transistor Rx is activated, the floating diffusion FD is initialized. As the floating diffusion FD is initialized, the reset voltage of the floating diffusion FD may increase. It is assumed that the reset voltage of the floating diffusion FD is 2.8V.

After the initialization of the floating diffusion FD, the reset transistor Rx is deactivated in the second period T2. When both of the transfer transistor Tx and the reset transistor Rx are deactivated, as incident light is radiated to the photoelectric conversion element PD in the state, photocharges are generated in the photoelectric conversion element PD, and the generated photocharges are accumulated in the photoelectric conversion element PD. It is assumed that, when the pinning voltage of the photoelectric conversion element PD is 2.3V, 5000 electrons are accumulated in the photoelectric conversion element PD at a point of time when the second period T2 expires.

In a third period T3, the reset transistor Rx is deactivated, and the transfer transistor Tx is turned on and off. During the third period T3, when the transfer transistor Tx is activated, the photocharges accumulated in the photoelectric conversion element PD are transferred to the floating diffusion FD. It is assumed that the voltage of the floating diffusion FD corresponding to 5000 electrons is 400 mV. In this case, the pinning voltage of the photoelectric conversion element PD and the floating diffusion FD has a potential difference of 100 mV.

In a fourth period T4, the reset transistor Rx and the transfer transistor Tx are deactivated, while the selection transistor Sx is activated. By activating the selection transistor Sx, an image signal or an image reset signal corresponding to the amount of the photocharges stored in the floating diffusion FD, that is, 400 mV, is outputted to the column line.

Next, a method for operating the image sensor in accordance with an embodiment of the disclosed technology will be described by referring to FIGS. 8 to 11. In the following, the descriptions on FIGS. 8 to 11 will be further provided in comparison with those on FIGS. 5 to 7 which explain the method for operating the image sensor based on the comparative example.

FIG. 8 is an equivalent circuit diagram illustrating a representation of an example of a pixel group of an image sensor based on an embodiment of the disclosed technology.

As shown in FIG. 8, the pixel group of the image sensor based on an embodiment of the disclosed technology may include a light receiving unit and a driving unit. The light receiving unit may include a plurality of light receiving units, and each of the plurality of light receiving units may include a photoelectric conversion element PD and a transfer transistor Tx. The driving unit may include a reset transistor Rx, a driver transistor Dx and a selection transistor Sx. The light receiving unit may further include a variable capacitor VC which is coupled in series with a floating diffusion FD and is capable of changing the effective capacitance of the floating diffusion FD. The floating diffusion FD may have a first capacitance value, and the variable capacitor VC may have a second capacitance value. The maximum value of the effective capacitance may be the same as the sum of the first capacitance value and the second capacitance value, and the minimum value of the effective capacitance may be the same as the first capacitance value.

The photoelectric conversion element PD may be or include a photodiode. The photoelectric conversion element PD may be coupled between a ground node VSS and the transfer transistor Tx. The transfer transistor Tx may be coupled between the photoelectric conversion element PD and the floating diffusion FD. The transfer transistor Tx may operate in response to a transfer signal TRF which is applied to a transfer gate TG. Referring to FIG. 2, the transfer signal TRF may be generated in the row driver 150 (see FIG. 1), and be applied to the transfer gate TG through the transfer line 260, the sixth contact plug 334, the pad pattern 250 and the second contact plug 324.

The variable capacitor VC may be coupled between the floating diffusion FD and the control line 270. The variable capacitor VC may change its capacitance, that is, the second capacitance value, in response to the control signal CON applied through the control line 270. As the variable capacitor VC is coupled in series with the floating diffusion FD, the variable capacitor VC may change the effective capacitance of the floating diffusion FD depending on the operations in response to the control signal CON applied to the variable capacitor VC through the control line 270. Referring to FIGS. 2, 4, and 8, the variable capacitor VC includes an electrode coupled to the control line 270 and another electrode coupled to the floating diffusion FD. The electrode of the variable capacitor VC coupled to the control line 270 may correspond to the variable electrode 240, and another electrode of the variable capacitor VC coupled to the floating diffusion FD may correspond to the conductive pattern 230. The control signal CON may be generated in the row driver 150, and be applied to the variable electrode 240 through the control line 270 and the fifth contact plug 332.

A first terminal (for example, the drain) of the reset transistor Rx may be coupled to a node which is set to a power supply voltage VDD, and a second terminal (for example, the source) of the reset transistor Rx may be coupled to the floating diffusion FD. The reset transistor Rx may operate in response to a reset signal RST which is applied to a reset gate RG. The gate of the driver transistor Dx, that is, a driver gate DG may be coupled to the floating diffusion FD. A first terminal (for example, the drain) of the driver transistor Dx may be coupled to the node which is set to the power supply voltage VDD, and a second terminal (for example, the source) of the driver transistor Dx may be coupled to the selection transistor Sx. The gate of the selection transistor Sx, that is, a selection gate SG may be coupled to a row line which extends from the row driver 150. A first terminal (for example, the drain) of the selection transistor Sx may be coupled to the driver transistor Dx, and a second terminal (for example, the source) of the selection transistor Sx may be coupled to a column line. The selection transistor Sx may output the image signal or the image reset signal generated in the driver transistor Dx, to the column line, in response to a select signal SEL applied to the selection gate SG through the row line. The image signal or the image reset signal may have an output voltage which is generated by processing the power supply voltage VDD. The generated output voltage of the image signal or the image reset signal may correspond to the amount of the photocharges stored in the floating diffusion FD.

Figure 9:
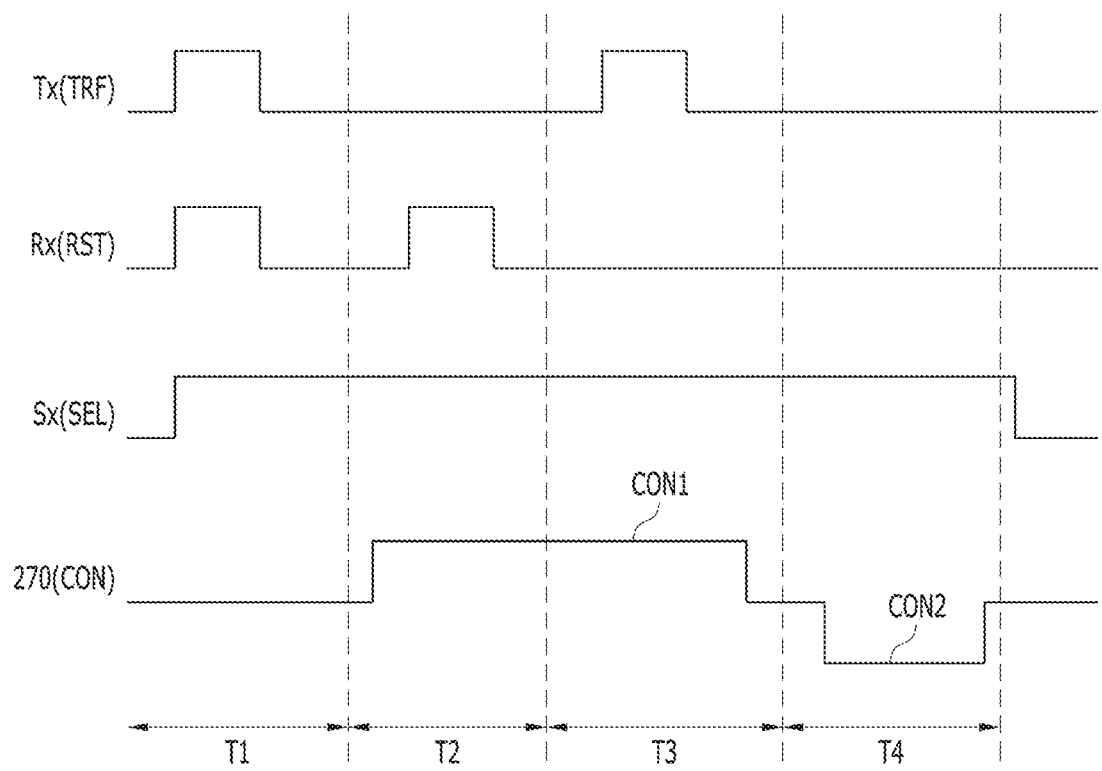
FIG. 9 is a representation of an example of a timing diagram to explain an operation of an image sensor in accordance with an embodiment of the disclosed technology.
Figure 11:
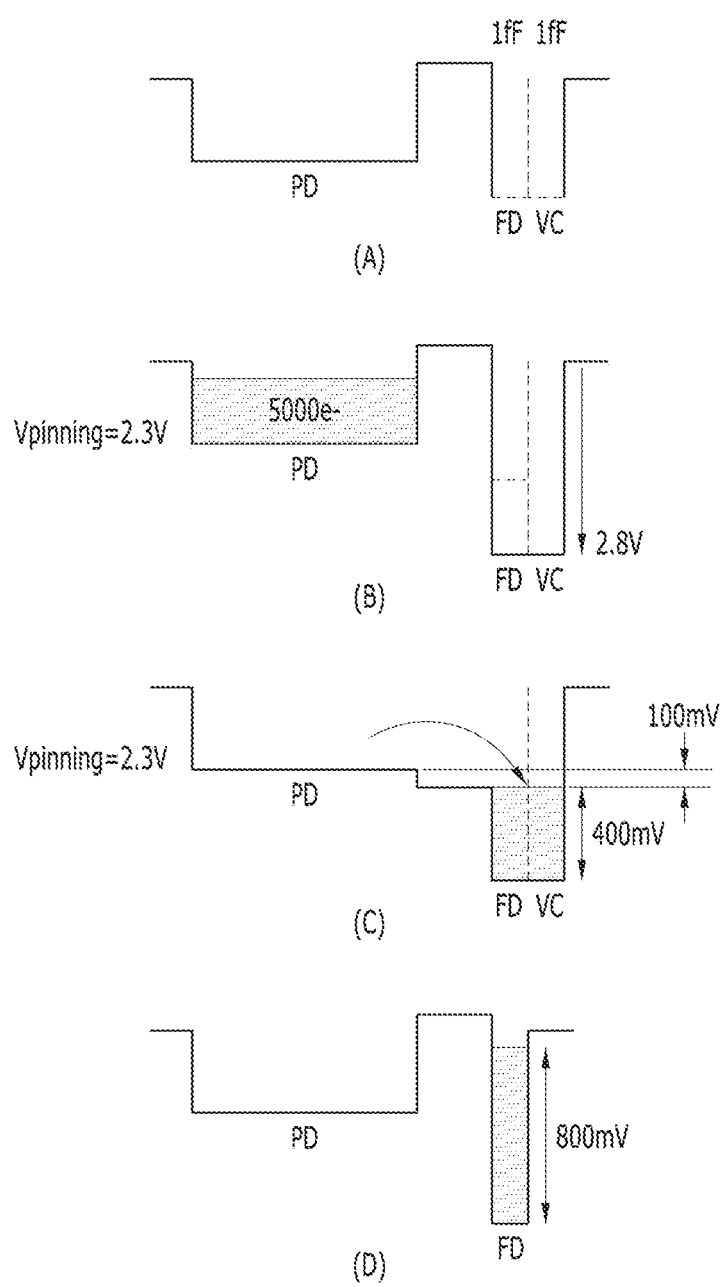
FIG. 11 is a schematic representation of an example of a diagram to explain a potential change and a capacitance change of a floating diffusion in an image sensor based on an embodiment of the disclosed technology.

FIG. 9 is a representation of an example of a timing diagram to explain the operation of the image sensor based on the embodiment of the disclosed technology, and FIG. 10 is a schematic representation of an example of a diagram to explain a potential change and a capacitance change of a floating diffusion in the image sensor depending on operations based on the embodiment. FIG. 11 is a schematic representation of an example of a diagram to explain a potential change and a capacitance change of a floating diffusion in an image sensor depending on operations based on another embodiment of the disclosed technology. The transfer transistor Tx shown in FIG. 9 indicates the transfer transistor Tx of any one of the plurality of light receiving units shown in FIG. 8. In FIG. 9, the reference symbols T1, T2, T3 and T4 respectively correspond to the reference symbols (A), (B), (C) and (D) of FIGS. 10 and 11. In FIGS. 10 and 11, it is assumed that the pinning voltage of the photoelectric conversion element PD is 2.3V. Further, it is assumed in FIG. 10 that the capacitance of each of the floating diffusion FD and the variable capacitor VC is 2 fF, and it is assumed in FIG. 11 that the capacitance of each of the floating diffusion FD and the variable capacitor VC is 1 fF.

As shown in FIGS. 8 to 11, in a first period T1, the photoelectric conversion element PD is initialized by activating the transfer transistor Tx and the reset transistor Rx. At this time, any signal may be applied to the control line 270.

Next, in the second period T2, the transfer transistor Tx is deactivated and the reset transistor Rx is turned on and turned off. In the second period T2, the floating diffusion FD and the variable capacitor VC are initialized simultaneously by deactivating the transfer transistor Tx, activating the reset transistor Rx, and applying a first control signal CON1 to the control line 270. The first control signal CON1 may have a positive bias. It is assumed that the reset voltage of the floating diffusion FD and the variable capacitor VC is 2.8V.

In the second period T2, after the initialization of the floating diffusion FD and the variable capacitor VC, incident light is radiated to the photoelectric conversion element PD in the state in which both the transfer transistor Tx and the reset transistor Rx are deactivated. Hence, photocharges are generated in the photoelectric conversion element PD, and the generated photocharges are accumulated in the photoelectric conversion element PD. It is assumed that, when the pinning voltage of the photoelectric conversion element PD is 2.3V, 5000 electrons are accumulated in the photoelectric conversion element PD at a point of time when the second period T2 expires.

In a third period T3, the reset transistor Rx is deactivated, and the transfer transistor Tx is turned on and off. During the third period T3, the photocharges accumulated in the photoelectric conversion element PD are transferred to the floating diffusion FD by activating the transfer transistor Tx. At this time, the first control signal CON1 may be applied to the control line 270 such that the effective capacitance of the floating diffusion FD is increased. The first control signal CON1 may have a positive bias.

Referring to FIG. 10, in the case where the capacitance of each of the floating diffusion FD and the variable capacitor VC is 2 fF, because the effective capacitance of the floating diffusion FD becomes 4 fF by the first control signal CON1, the voltage of the floating diffusion FD corresponding to the 5000 electrons may be 200 mV. In this case, the pinning voltage of the photoelectric conversion element PD and the floating diffusion FD has a potential difference of 300 mV. As compared to the comparative example shown FIGS. 5 to 7, the image sensor based on the embodiment of the disclosed technology has an increased effective capacitance. The increased effective capacitance of the floating diffusion FD can improve photocharge transfer efficiency when transferring the photocharges accumulated in the photoelectric conversion element PD, to the floating diffusion FD. Also, the increased effective capacitance of the floating diffusion can effectively prevent the occurrence of a lag.

FIG. 11 shows a schematic representation of an example of a diagram to explain a potential change and a capacitance change of a floating diffusion in an image sensor. In FIG. 11, each of the floating diffusion FD and the variable capacitor VC is 1 fF and the pinning voltage of the photoelectric conversion element PD is 2.3V. Referring to FIG. 11, in the case where the capacitance of each of the floating diffusion FD and the variable capacitor VC is 1 fF, the effective capacitance of the floating diffusion FD, which corresponds to the sum of the capacitance values of the floating diffusion FD and the variable capacitor VC, becomes 2 fF by the first control signal CON1. Given that it is assumed in the image sensor of FIGS. 5 to 7 with the capacitance value, 2 fF, of the floating diffusion FD that the voltage of the floating diffusion FD corresponding to 5000 electrons is 400 mV, since the effective capacitance of the floating diffusion FD of FIG. 11 has the same capacitance value as that in FIG. 7, the voltage of the floating diffusion FD is 400 mV. In this case, the pinning voltage of the photoelectric conversion element PD and the floating diffusion FD has a potential difference of 100 mV. Hence, even when the capacitance of the floating diffusion FD is designed to be smaller than in the comparative example, it is possible to realize the same or improved characteristics in comparison with the comparative example, through the variable capacitor VC. In addition, occurrence of a lag can be suppressed.

Referring back to FIG. 9, in a fourth period T4, by activating the selection transistor Sx, an image signal or an image reset signal corresponding to the amount of the photocharges stored in the floating diffusion FD is outputted to the column line. At this time, in order to decrease the effective capacitance of the floating diffusion FD such that a conversion gain is increased, a second control signal CON2 may be applied to the control line 270. The second control signal CON2 may have a polarity opposite to the first control signal CON1. For example, the second control signal CON2 may have a negative bias.

Referring to FIG. 10, in the case where the capacitance of each of the floating diffusion FD and the variable capacitor VC is 2 fF, because the effective capacitance of the floating diffusion FD becomes 2 fF by the second control signal CON2, the voltage of the floating diffusion FD increases from 200 mV to 400 mV. That is to say, even though the variable capacitor VC is provided, it is possible to prevent a version gain from decreasing due to an increase in the capacitance of the floating diffusion FD. Therefore, the same or improved sensitivity and HDR characteristics can be realized.

Referring to FIG. 11, in the case where the capacitance of each of the floating diffusion FD and the variable capacitor VC is 1 fF, because the effective capacitance of the floating diffusion FD becomes 1 fF by the second control signal CON2, the voltage of the floating diffusion FD increases from 400 mV to 800 mV. Thus, a conversion gain may be improved further in comparison with the comparative example. Therefore, sensitivity and HDR characteristics may be improved further in comparison with the comparative example.

The image sensor in accordance with the above-described embodiments can be used in various electronic devices or systems. Hereafter, a case in which the image sensor in accordance with the embodiments is applied to a camera will be described with reference to FIG. 12.

Figure 12:
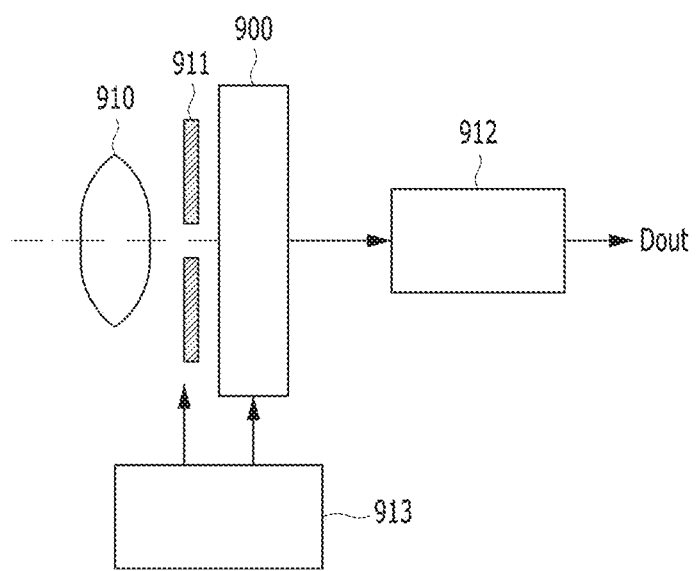
FIG. 12 is a diagram schematically illustrating a representation of an example of an electronic device including an image sensor based on an embodiment of the disclosed technology.

FIG. 12 is a diagram schematically illustrating a representation of an example of an electronic device including the image sensor based on an embodiment of the disclosed technology.

Referring to FIG. 12, the electronic device including the image sensor based on the embodiment of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array (see the reference numeral 100 of FIG. 1) of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

As is apparent from the above descriptions, in this patent document, since a variable capacitor capable of changing the effective capacitance of a floating diffusion is provided, the occurrence of a lag can be prevented and sensitivity and HDR characteristics can be improved.

Further, since the variable capacitor is realized by using a conductive pattern coupled to the floating diffusion and a variable electrode neighboring the conductive pattern with a gap, a separate area for the variable capacitor is not needed. Hence, characteristics of the image sensor can be improved without increasing a pixel size.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An image sensor device comprising:
   a photoelectric conversion element disposed in a substrate and configured to receive incident light and generate photocharges in response to the received incident light;
   a floating diffusion disposed in the substrate and coupled to the photoelectric conversion element to store the photocharges generated by the photoelectric conversion element, the floating diffusion having a first capacitance value;
   a conductive pattern electrically coupled to the floating diffusion and disposed on a first surface of a first interlayer dielectric layer disposed over the substrate, the first interlayer dielectric layer having a second surface opposite to the first surface and the substrate located closer to the second surface than the first surface; and
   a variable electrode disposed on the first interlayer dielectric layer and located apart from the conductive pattern by a gap, the variable electrode and the conductive pattern disposed on a same height level as each other,
   wherein the conductive pattern and the variable electrode form a variable capacitor coupled to the floating diffusion and having a second capacitance value and operable to change an effective capacitance of the floating diffusion in response to a control signal applied to the variable electrode.

2. The image sensor device according to claim 1, further comprising:
a dielectric layer filling the gap.

3. The image sensor device according to claim 1, further comprising:
a reset transistor having a terminal coupled to the floating diffusion and operable to initialize the floating diffusion; and
a driver transistor having a terminal coupled to the floating diffusion and operable to generate an output signal corresponding to an amount of the photocharges stored in the floating diffusion,
wherein the conductive pattern electrically couples the floating diffusion to the reset transistor, and electrically couples the floating diffusion to the driver transistor.

4. The image sensor device according to claim 1, wherein the conductive pattern has at least one sidewall which faces a sidewall of the variable electrode.

5. The image sensor device according to claim 1, wherein the conductive pattern and the variable electrode have a bar shape with a major axis extending in a same direction.

6. The image sensor device according to claim 1,
wherein a maximum value of the effective capacitance is determined as a sum of the first capacitance value and the second capacitance value, and a minimum value of the effective capacitance is determined as same as the first capacitance value.

7. An image sensor device comprising:
a transfer gate formed over a substrate;
a photoelectric conversion element and a floating diffusion formed in the substrate on the respective sides of the transfer gate;
a first interlayer dielectric layer formed over the substrate, and covering the transfer gate, the first interlayer dielectric layer having a first surface and a second surface that is located closer to the substrate than the first surface and opposite to the first surface;
a conductive pattern formed on the first surface of the first interlayer dielectric layer, and electrically coupled with the floating diffusion; and
a variable electrode formed on the first surface of the first interlayer dielectric layer and located apart from the conductive pattern with a first gap, the variable electrode and the conductive pattern disposed on a same height level as each other, wherein the variable electrode is operable to change an effective capacitance of the floating diffusion in response to a control signal applied to the variable electrode.

8. The image sensor device according to claim 7, further comprising:
a reset transistor having a terminal coupled to the floating diffusion and operable to initialize the floating diffusion; and
a driver transistor having a terminal coupled to the floating diffusion and operable to generate an output signal corresponding to an amount of photocharges stored in the floating diffusion,
wherein the conductive pattern electrically couples the floating diffusion to the reset transistor, and electrically couples the floating diffusion to the driver transistor.

9. The image sensor device according to claim 7, further comprising:
a pad pattern formed over the first interlayer dielectric layer, and electrically coupled with the transfer gate.

10. The image sensor device according to claim 9, wherein the variable electrode is located apart from the pad pattern by a second gap with a width greater than that of the first gap.

11. The image sensor device according to claim 9, wherein the variable electrode is positioned between the conductive pattern and the pad pattern.

12. An image sensor device comprising:
a transfer gate formed over a substrate;
a photoelectric conversion element and a floating diffusion formed in the substrate on the respective sides of the transfer gate;
a first interlayer dielectric layer formed over the substrate, and covering the transfer gate;
a conductive pattern formed over the first interlayer dielectric layer, and electrically coupled with the floating diffusion; and
a variable electrode formed over the first interlayer dielectric layer and located apart from the conductive pattern with a first gap, the variable electrode and the conductive pattern disposed on a same height level as each other, wherein the variable electrode is operable to change an effective capacitance of the floating diffusion in response to a control signal applied to the variable electrode, wherein the image sensor further comprises:
a second interlayer dielectric layer formed over the first interlayer dielectric layer, covering the conductive pattern and the variable electrode, and filling the first gap.

13. The image sensor device according to claim 7, wherein the conductive pattern has at least one sidewall which faces a sidewall of the variable electrode.

14. The image sensor device according to claim 7, wherein the conductive pattern and the variable electrode have a bar shape with a major axis extending in a same direction.

15. A method for operating an image sensor device, the method comprising:
initializing an image sensor device with a floating diffusion to cause the floating diffusion to have a first capacitance value, the floating diffusion disposed in a substrate;
applying a first control signal to the image sensor device to cause the floating diffusion to have an increased effective capacitance that is greater than the first capacitance value; and
applying a second control signal to the image sensor device to cause the floating diffusion to have the effective capacitance smaller than the increased effective capacitance,
wherein the image sensor device includes a variable capacitor comprising:
a conductive pattern electrically coupled with the floating diffusion and disposed on a first surface of a first interlayer dielectric layer that has a second surface opposite to the first surface and located closer to the substrate than the first surface; and
a variable electrode disposed on the first surface of the first interlayer dielectric layer and located apart from the conductive pattern by a gap, the variable electrode and the conductive pattern disposed on a same height level as each other,
wherein the first and second control signals are applied to the variable electrode.

16. The method according to claim 15, further comprising, after the initializing of the image sensor and before the applying of the second control signal:
generating photocharges in the image sensor device; and transferring the generated photocharges to the floating diffusion.

17. The method according to claim 15, wherein the image sensor device includes a variable capacitor having a second capacitance value coupled in series to the floating diffusion; and wherein the increased effective capacitance has a maximum value as same as a sum of the first capacitance value and the second capacitance value, and a minimum value same as the first capacitance value.

18. The method according to claim 15, wherein the first control signal has a polarity opposite to the second control signal.

19. The method according to claim 18, wherein the first control signal has a positive bias, and the second control signal has a negative bias.

* * * * *